(12) United States Patent
Chang et al.

(10) Patent No.: US 6,232,198 B1
(45) Date of Patent: May 15, 2001

(54) METHOD FOR FABRICATING ELECTRODE

(76) Inventors: Ting-Chang Chang, No. 1001-1, Ta-Hsueh Road; Po-Tsun Liu, 6Fl., No. 11, Alley 71, Lane 376, Kuang-Fu Rd. Sec. 1, both of Hsinchu (TW)

( * ) Notice: Subject to any disclaimer, the term of this patent is extended or adjusted under 35 U.S.C. 154(b) by 0 days.

(21) Appl. No.: 09/321,510

(22) Filed: May 27, 1999

(51) Int. Cl.[7] ................................................. H01L 21/20
(52) U.S. Cl. ............................................ 438/396; 438/253
(58) Field of Search ................................. 438/396, 253, 438/397, 643, 650, 660, 686

(56) References Cited

U.S. PATENT DOCUMENTS 5,789,320 * 8/1998 Andricacos et al. ................. 438/678

* cited by examiner

Primary Examiner—David Nelms
Assistant Examiner—Quoc Hoang

(57) ABSTRACT

A method for fabricating a noble metal electrode of a capacitor. A substrate having a doped region is provided. A dielectric layer is formed to cover the substrate including the doped region with a contact is penetrating through the dielectric layer to couple with the doped region. A barrier layer is formed to cover the dielectric layer and the contact. A polysilicon layer is formed on the barrier layer. The polysilicon layer and TiN barrier layer are etched to form an electrode pattern. The chip is immersed in a solution having noble metal ions and reducing agent for the noble metal ions. In such solution, a displacement reaction takes place to displace the polysilicon layer by a noble metal layer. After the immersion step, the chip is annealed to densify the noble metal layer.

20 Claims, 2 Drawing Sheets

METHOD FOR FABRICATING ELECTRODE

BACKGROUND OF THE INVENTION

1. Field of the Invention

The invention relates to an electrode process. More particularly, the invention relates to a method for fabricating a bottom electrode of a capacitor.

2. Description of the Related Art

As the semiconductor technology being greatly developed, millions of transistors are formed on a chip. Such chip, belongs to an Ultra-Large-Scale Integrated (ULSI) generation, has a need of high speed and access memory capacitance. For this need, techniques of applying a material with a high dielectric constant as a capacitor dielectric layer are greatly developed. For example, a BST ((Ba, Sr)$TiO_3$) dielectric material, which has a high dielectric constant and a low film leakage current, is broadly applied to dynamic random access memories (DRAMs) with 4G bits or more access capacitance. Moreover, a noble metal, such as platinum (Pt), is used as an electrode material of capacitors of such memories. Pt has many inherent advantages, such as a low leakage current, a high conductivity and an improvement in problem of a depletion region in a dual-polysilicon capacitor.

Referring to FIG. 1, a Pt electrode 108 is shown. The drawing further shows a substrate 100 with a doped area 106, a dielectric layer 102 having a contact 104, and a TiN barrier layer 110 over the contact 104.

The method of fabricating the Pt electrode 108 comprises a step of forming a Pt layer, followed by a photolithography and etching step. As shown in the figure, due to the difficulty in etching the Pt layer, surface area is reduced after being etched. As a consequence, the capacitance of a capacitor based on the Pt electrode 108 is reduced.

SUMMARY OF THE INVENTION

The invention provides a method for fabricating a noble metal electrode. A silicon layer and a solution are provided, wherein the solution has a noble metal complex and a reductant. The silicon layer is immersed in the solution, thereby the silicon layer is displaced by a metal layer. By the displacement from the silicon layer into the metal layer, a metal bottom electrode is formed without suffering from the difficulty in an etching step. Therefore, the disadvantage of reduced surface area can be resolved.

With the optimum surface area of the metal electrode, the inherent advantages for using a noble metal electrode such as high conductivity and low leakage current, and the implementation of a capacitor dielectric layer with a high dielectric constant, a high reliability and performance of devices can be achieved.

In one embodiment of the invention, a dielectric layer is formed to cover a substrate comprising a doped region. A contact coupled to the doped region is formed to penetrate through the dielectric layer. A titanium nitride layer is formed to couple with the contact above the dielectric layer. A silicon layer is formed to cover the titanium nitride layer. The silicon layer is immersed in a solution containing platinum tetrechloride and hydrogen fluoride. A displacement reaction is thus produced. As a result, the titanium nitride layer is covered by a platinum layer serving as a bottom electrode instead of being covered by the silicon layer. An annealing step is performed on the platinum layer to obtain a densified structure thereof.

It is to be understood that both the foregoing general description and the following detailed description are exemplary and explanatory only and are not restrictive of the invention, as claimed.

DESCRIPTION OF THE PREFERRED EMBODIMENTS

As mentioned above, applying a noble metal to form a bottom electrode accompanied with a dielectric layer with a high dielectric constant (high κ dielectric layer), a high conductivity, low leakage current, and a high storage capacitance can be obtained. However, by the conventional method, the noble metal bottom electrode has to be formed by suffering the difficulty of an etching step. The resultant bottom electrode thus has a reduced effective surface area. In the invention, instead of using an etching step, the noble metal electrode is formed by a displacement reaction. A silicon layer is formed on a contact and immersed into a solution containing the noble metal ions and a reducing agent, so as to generate a reduction on the noble metal ions. As a result, the silicon layer is displaced by a reduced noble metal layer.

FIGS. 2A–2E are schematic, cross-sectional views illustrating steps for fabricating a noble metal electrode process according to the present invention. In this embodiment, platinum is used as an example for the noble metal. It is appreciated that the method provided by the invention is not limited to the formation of platinum electrode only. Electrodes made of material such as gold (Au), silver (Ag), palladiem (Pd) or other noble metals can also be formed by applying this method with the application of appropriate reducing agents.

Figure 1:
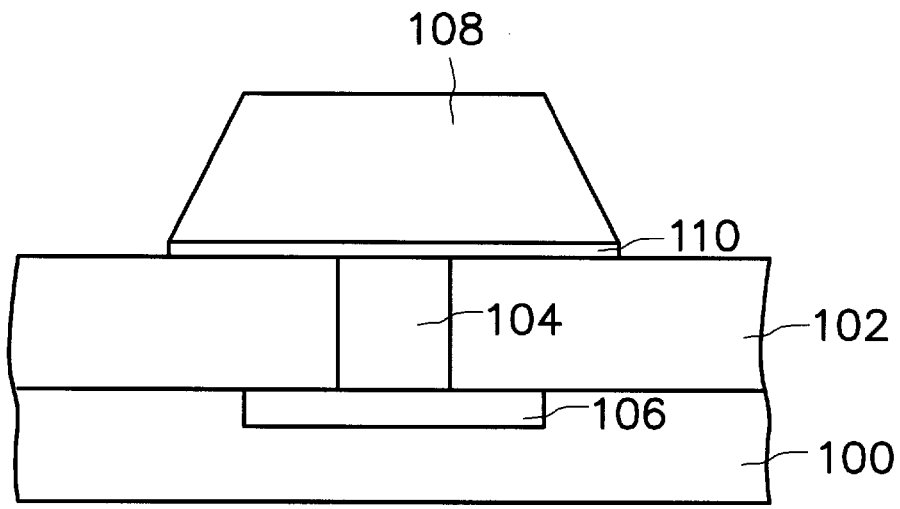
FIG. 1 is a schematic, cross-sectional view of a conventional platinum electrode.
Figure 2A:
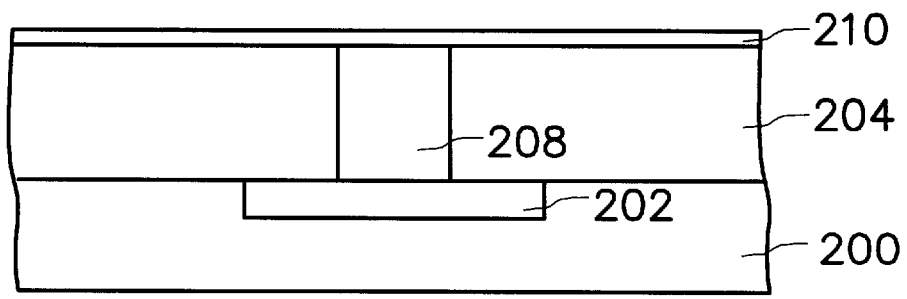
FIGS. 2A–2E are schematic, cross-sectional views illustrating steps for forming a noble metal in one embodiment according to the present invention.

Referring to FIG. 2A, a substrate 200 is provided. The substrate 200 may comprises devices such as shallow trench isolation (not shown) to define an active region, and devices such as metal-oxide semiconductors (MOS) (not shown) formed in the active region. The substrate 200 further comprises a doped region 202, for example, a source/drain region of one of the metal-oxide semiconductors or other conductive region. A dielectric layer 204, for example, a boro-phospho-silicate (BPSG) formed by chemical vapor deposition (CVD) is formed to cover the substrate 200 including the doped region 202. A planarization step, for example, a chemical-mechanical polishing step, is typically performed on the dielectric layer 204 to obtain an improved topography which is advantageous to the subsequent fabricating processes. A contact 208 is formed to penetrate through the dielectric layer 204 to couple with the doped region 202. A barrier layer 210, for example, a titanium nitride layer, is formed to cover the dielectric layer 204 and the contact 208. The barrier layer 210 is formed in order to enhance the adhesion between the contact 208 and a subsequently formed metal layer, additionally, the barrier layer 210 also has a function of preventing diffusion of the metal layer into the dielectric layer 204 or other undesirable action.

Figure 2B:
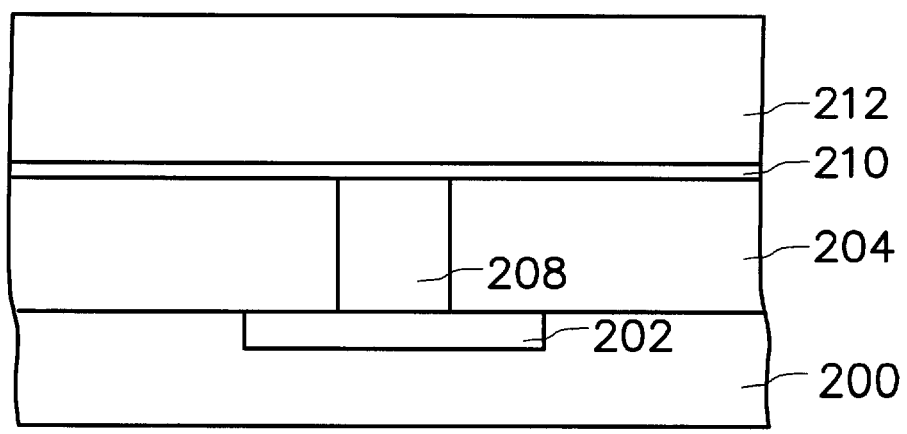

In FIG. 2B, a silicon layer 212, for example, a polysilicon layer or an amorphous silicon layer formed by low pressure CVD (LPCVD), is formed on the barrier layer 210. In the LPCVD process, silane ($SiH_4$) is used as a reacting gas source. The reacting temperature is controlled at a temperature lower than about 575° C. for forming the polysilicon layer, while the a temperature is controlled at about 600° C. to about 650° for forming the amorphous silicon layer. The pressure for both the polysilicon layer and the amorphous silicon layer is about 0.3 Torr to about 0.6 Torr.

Figure 2C:
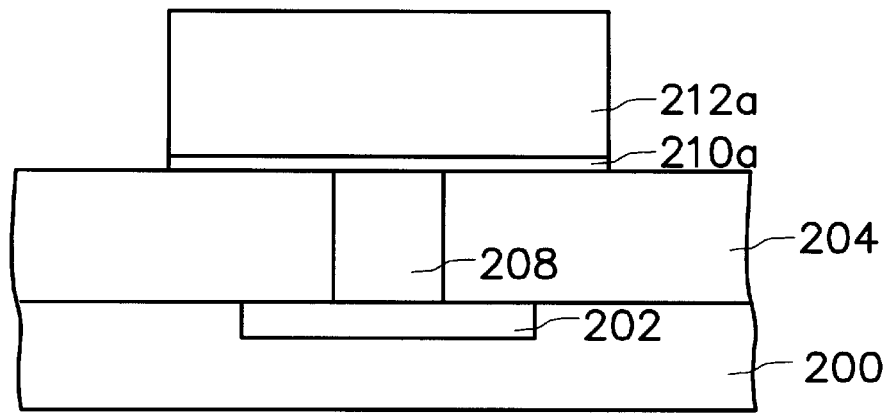

Using photolithography and etching techniques, the silicon layer 212 and the barrier layer 210 are patterned into the silicon layer 212a and the barrier layer 210a as shown in FIG. 2C. In this step, the geometric shape of the patterned silicon layer 212a is determined as specifically required. For example, to meet the demand in large contact or surface area, the silicon layer may be formed with a crown, fin or cylindrical shape. Furthermore, hemispherical grain structure (HSG) may also be formed along the surface of the patterned silicon layer 212a to further increase surface area.

Figure 2D:
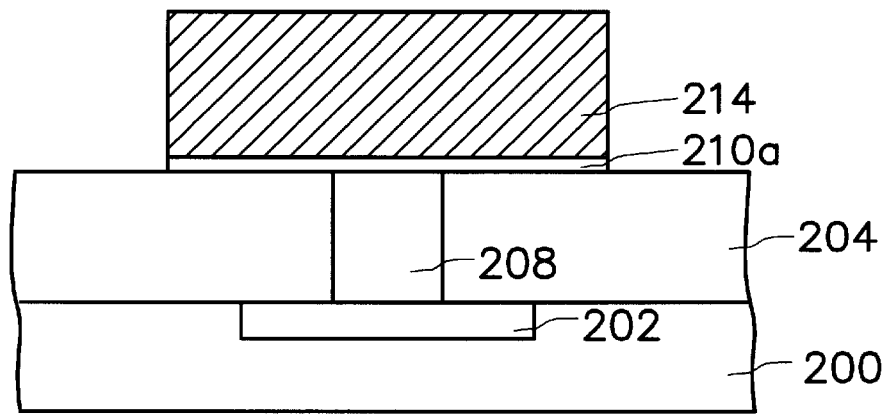

In FIG. 2D, the silicon layer 212a is immersed in a solution having $PtCl_4^{2-}$ ions and hydrofluoric acid. In such solution, a displacement reaction takes place to substitute the polysilicon layer 212a (shown in FIG. 2C) for a platinum (Pt) layer 214. This reaction can be written as follows:

The above formula can be presented by formula as:

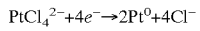

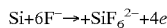

The $PtCl_4^{2-}$ supplies platinum ion, $Pt^{6+}$, for forming the platinum layer. The hydrofluoric acid, which is a strong reductant, is used to reduce the $Pt^{6+}$ into $Pt^0$. After this immersing step, the chip is annealed to condense platinum as the platinum layer 214 as shown in the figure. Therefore, the platinum layer 214 can be formed without the electroplating and etching steps. The surface area can thus be optimized.

Figure 2E:
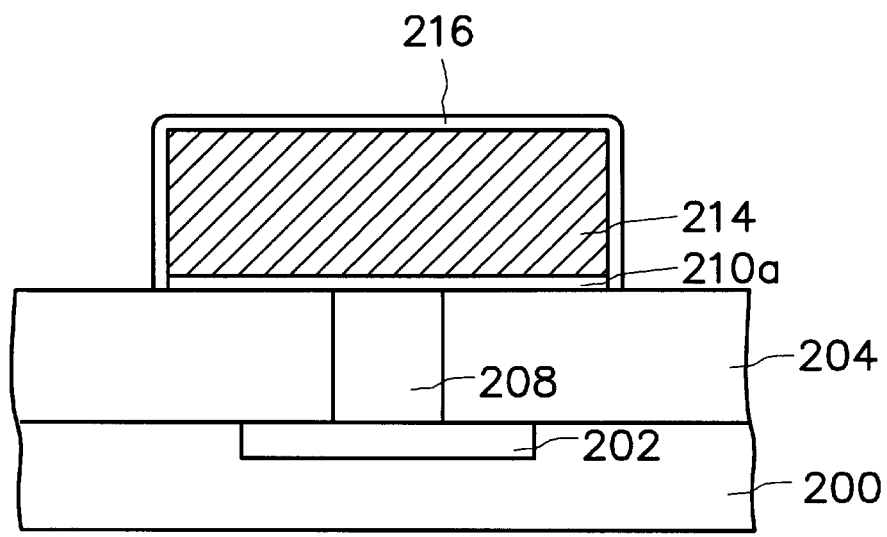

As shown in FIG. 2E, a layer of high dielectric constant 216 is formed to cover the Pt layer 214. The high K layer 216 is, for example, a BST ($(Ba, Sr)TiO_3$) layer. The dielectric layer 216 can be covered with another conductive layer for forming a capacitor. Such step is a conventional step simply not presented here.

The present invention uses a new method rather than using elecrtoplating and etching to form a Pt layer as an electrode of a capacitor. The Pt layer is formed without etching, and the effective capacitor area as well as the effective capacitance can be therefore increased. Since the Pt layer facilitates the increase of the effective capacitance and has many inherent advantages, it is applicable to DRAM techniques.

Moreover, forming Pt electrode without etching enhances the controllability and reliability of the process. One reason of this enhancement is the Pt electrode is suitable for being covered by a BST layer, wherein the BST is a material of high dielectric constant.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method for fabricating a noble metal electrode, comprising:

providing a silicon bottom electrode; and immersing the silicon bottom electrode in a solution containing a noble metal ion and a reducing agent, thereby displacing the silicon bottom electrode into a noble metal bottom electrode.

2. The method of claim 1, wherein the noble metal comprises platinum.

3. The method of claim 2, wherein the noble metal ions comprise $PtCl_4^{2-}$ and the reducing agent comprises hydrofluoric acid.

4. The method of claim 1, wherein the silicon layer comprises s a polysilicon layer.

5. The method of claim 1, wherein the silicon layer comprises an amorphous silicon layer.

6. The method of claim 1, comprising further a step of annealing the immersing step.

7. The method of claim 6, comprising further the steps:

forming a dielectric layer having a high dielectric constant to cover the noble metal bottom electrode; and forming a top electrode to cover the dielectric layer.

8. A method for fabricating an electrode of a capacitor, comprising:

providing a substrate having a doped region thereon;

forming a dielectric layer with an contact coupled with the doped region therein;

forming a silicon layer on the dielectric layer and the contact; and performing a displacement reaction on the silicon layer, so as to displace the silicon layer with a noble metal layer; and performing an annealing step on the noble metal layer.

9. The method of claim 8, wherein the doped region comprises a source/drain region.

10. The method of claim 8, wherein the silicon layer comprises a polysilicon layer.

11. The method of claim 8, wherein the silicon layer comprises an amorphous silicon layer.

12. The method of claim 8, comprising further a step of forming a barrier layer on the dielectric layer and the contact before the step of forming the silicon layer.

13. The method of claim 8, comprises further the steps of forming a high κ dielectric layer on the noble metal layer.

14. The method of claim 13, wherein the high κ dielectric layer comprises a $(Ba, Sr)TiO_3$ layer.

15. The method of claim 8, wherein the noble metal comprises a palladium layer.

16. The method of claim 8, wherein the noble metal comprises a platinum layer.

17. The method of claim 15, wherein the step of displacement is performed by immersing the silicon layer into a solution comprising $PtCl_4^{2-}$ ions and hydrogen fluoride.

18. A method for fabricating an electrode, comprising:

forming a silicon layer over a substrate;

immersing the silicon layer into a solution containing platinum ions and reducing agent to reduce the platinum ions; and performing an densification step.

19. The method of claim 18, wherein the reducing agent comprises hydrogen fluoride.

20. The method of claim 18, wherein the densification step comprises an annealing step.

* * * * *